(12) United States Patent
Lau et al.

(10) Patent No.: US 9,349,628 B2
(45) Date of Patent: May 24, 2016

(54) METHOD AND AN ALIGNMENT PLATE FOR ENGAGING A STIFFENER FRAME AND A CIRCUIT BOARD

(71) Applicant: Advanced Micro Devices, Inc., Sunnyvale, CA (US)

(72) Inventors: Wei-Chin Lau, Bayan Lepas (MY); Hai-Wah Lim, Bayan Lepas (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 287 days.

(21) Appl. No.: 13/848,549

(22) Filed: Mar. 21, 2013

(65) Prior Publication Data

US 2014/0237815 A1    Aug. 28, 2014

Related U.S. Application Data

(60) Provisional application No. 61/768,829, filed on Feb. 25, 2013.

(51) Int. Cl.
*H05K 3/00* (2006.01)
*H01L 21/68* (2006.01)
(Continued)

(52) U.S. Cl.
CPC ............... *H01L 21/68* (2013.01); *H01L 23/16* (2013.01); *H01L 24/10* (2013.01); *H05K 3/0008* (2013.01); *H01L 24/13* (2013.01); *H01L 24/16* (2013.01);
(Continued)

(58) Field of Classification Search
CPC ....... H01L 21/673; H01L 21/68; H01L 21/50; Y10T 29/49133; Y10T 29/49124; Y10T 29/53178

USPC ............................................ 29/740, 829, 834
See application file for complete search history.

(56) References Cited

U.S. PATENT DOCUMENTS

| 5,021,865 A | * | 6/1991 | Takahashi et al. ............ 257/676 |
| 5,317,183 A | * | 5/1994 | Hoffman et al. .............. 257/369 |

(Continued)

FOREIGN PATENT DOCUMENTS

| DE | 4031051 A1 | 5/1991 |
| DE | 4338393 A1 | 5/1995 |

(Continued)

OTHER PUBLICATIONS

International Search Report in International Application No. PCT/US00/31962, mailed Apr. 26, 2001, 3 pages.
(Continued)

*Primary Examiner* — Paul D Kim
(74) *Attorney, Agent, or Firm* — Rory D. Rankin; Meyertons, Hood, Kivlin, Kowert & Goetzel, P.C.

(57) ABSTRACT

Methods and apparatus for coupling a stiffener frame to a circuit board are disclosed. In one aspect, a method for engaging a stiffener frame and a circuit board positioned in a fixture is provided. The method includes positioning an alignment plate on the stiffener frame, such that a downwardly facing shoulder of a bottom opening of the alignment plate is seated on a setback of the stiffener frame, wherein the bottom opening of the alignment plate is larger than the a top opening of the alignment plate. The circuit board is positioned on the stiffener frame. The alignment plate restrains movement of the circuit board relative to the stiffener frame with a peripheral wall of a the top opening of the alignment plate.

24 Claims, 8 Drawing Sheets

(51) Int. Cl.
*H01L 23/16* (2006.01)
*H01L 23/00* (2006.01)
*H05K 3/34* (2006.01)

(52) U.S. Cl.
CPC .............. *H01L 24/48* (2013.01); *H01L 24/83* (2013.01); *H01L 2224/10155* (2013.01); *H01L 2224/131* (2013.01); *H01L 2224/13144* (2013.01); *H01L 2224/16225* (2013.01); *H01L 2224/16227* (2013.01); *H01L 2224/48227* (2013.01); *H01L 2224/73204* (2013.01); *H01L 2224/83102* (2013.01); *H01L 2224/83862* (2013.01); *H01L 2924/12042* (2013.01); *H01L 2924/15311* (2013.01); *H01L 2924/351* (2013.01); *H05K 3/3436* (2013.01); *H05K 2201/09145* (2013.01); *H05K 2201/10674* (2013.01); *H05K 2201/10977* (2013.01); *H05K 2203/0165* (2013.01); *H05K 2203/0169* (2013.01); *H05K 2203/0278* (2013.01); *H05K 2203/167* (2013.01); *Y10T 29/49124* (2015.01); *Y10T 29/49133* (2015.01); *Y10T 29/53178* (2015.01); *Y10T 156/10* (2015.01)

(56) References Cited

U.S. PATENT DOCUMENTS

| | | | | |
|---|---|---|---|---|
| 5,357,404 A | * | 10/1994 | Bright et al. | 361/818 |
| 5,367,193 A | * | 11/1994 | Malladi | 257/707 |
| 5,381,037 A | * | 1/1995 | Olivarez | 257/666 |
| 5,389,817 A | * | 2/1995 | Imamura et al. | 257/666 |
| 5,396,403 A | * | 3/1995 | Patel | 361/705 |
| 5,552,635 A | * | 9/1996 | Kim et al. | 257/706 |
| 5,585,671 A | * | 12/1996 | Nagesh et al. | 257/697 |
| 5,594,624 A | * | 1/1997 | Clemens et al. | 361/704 |
| 5,651,688 A | * | 7/1997 | Lin | 439/331 |
| 5,710,459 A | * | 1/1998 | Teng et al. | 257/717 |
| 5,745,344 A | * | 4/1998 | Baska et al. | 361/705 |
| 5,777,852 A | * | 7/1998 | Bell | 361/769 |
| 5,804,468 A | * | 9/1998 | Tsuji et al. | 438/122 |
| 5,847,928 A | * | 12/1998 | Hinshaw et al. | 361/704 |
| 5,850,691 A | | 12/1998 | Bell | |
| 5,907,474 A | * | 5/1999 | Dolbear | 361/705 |
| 5,990,552 A | * | 11/1999 | Xie et al. | 257/718 |
| 6,049,702 A | * | 4/2000 | Tham et al. | 455/78 |
| 6,108,207 A | * | 8/2000 | Lee | 361/704 |
| 6,331,728 B1 | * | 12/2001 | Chang et al. | 257/676 |
| 6,483,178 B1 | * | 11/2002 | Chuang | 257/672 |
| 6,504,243 B1 | * | 1/2003 | Andric et al. | 257/718 |
| 6,528,868 B1 | * | 3/2003 | Weiblen et al. | 257/669 |
| 6,538,866 B1 | * | 3/2003 | Hanzawa et al. | 361/91.1 |
| 6,852,567 B1 | * | 2/2005 | Lee et al. | 438/106 |
| 6,870,258 B1 | | 3/2005 | Too | |
| 2002/0145180 A1 | * | 10/2002 | Terui et al. | 257/666 |
| 2003/0151123 A1 | * | 8/2003 | Huschka et al. | 257/678 |
| 2004/0159929 A1 | | 8/2004 | Huschka et al. | |
| 2014/0237815 A1 | * | 8/2014 | Lau et al. | 29/834 |

FOREIGN PATENT DOCUMENTS

| | | |
|---|---|---|
| EP | 0712160 A2 | 5/1996 |
| JP | H01124244 A | 5/1989 |
| JP | H0494565 A | 3/1992 |
| JP | H0685151 A | 3/1994 |
| JP | H06236959 A | 8/1994 |
| JP | H1098150 A | 4/1998 |
| WO | 9620502 A1 | 7/1996 |

OTHER PUBLICATIONS

Herrell, Dennis J., U.S. Appl. No. 08/620,670, entitled "Low-Cost Method of Packaging Multiple Integrated Circuit Chips in a Standard Semiconductor Device Package Intended for a Single Chip", filed Mar. 26, 1996, 26 pages.
Translation of Official Communication in German Application No. 10205563.7-33, mailed Nov. 30, 2004, 2 pages.
Translation of Official Communication in German Application No. 10205563.7-33, mailed Apr. 25, 2006, 2 pages.

* cited by examiner

METHOD AND AN ALIGNMENT PLATE FOR ENGAGING A STIFFENER FRAME AND A CIRCUIT BOARD

CROSS REFERENCE TO RELATED APPLICATIONS

This application claims the benefit of priority to U.S. Provisional Patent Application No. 61/768,829, entitled "Stiffener Frame Fixture," filed Feb. 25, 2013, the entirety of which is incorporated herein by reference.

TECHNICAL FIELD

This invention relates generally to semiconductor processing, and more particularly to methods and apparatus for curing stiffener ring adhesives.

BACKGROUND

Many current integrated circuits are formed as multiple semiconductor chips on a common silicon wafer. After the basic process steps to form the circuits on the semiconductor chips are complete, the individual semiconductor chips are cut or singulated from the wafer. The singulated semiconductor chips are then usually mounted to structures, such as circuit boards, or packaged in some form of enclosure.

One frequently-used package consists of a substrate upon which a semiconductor chip is mounted. The upper surface of the substrate includes conductive pads. The semiconductor chip is manufactured with a plurality of bump pads. A collection of solder joints are provided between the bump pads of the semiconductor chip and the corresponding conductive pads of the package substrate to establish ohmic contact. After the semiconductor chip is seated on the substrate, a reflow process is performed to enable the solder bumps of the semiconductor chip to metallurgically link to the solder pads of the substrate.

For conventional semiconductor chip packages, there may be significant differences in the coefficients of thermal expansion (CTE) of the semiconductor chip, the package substrate and the solder joints. Large differences in CTE coupled with thermal stresses associated with testing and operation can impose significant strains on solder joints. To lessen the effects of differential CTE, an underfill material is often deposited between the semiconductor chip and the package substrate to act as a material that inhibits damage to the solder bumps due to mismatches in CTE.

One conventional type of substrate consists of a core laminated between upper and lower build-up layers. The core itself usually consists of four layers of glass-filled epoxy. The build-up layers, which may number four or more on opposite sides of the core, are formed from some type of resin. Various metallization structures are interspersed in the core and build-up layers in order to provide electrical pathways between pins or pads on the lowermost layer of the substrate and pads that bond with the chip solder bumps.

The core provides a particular stiffness to the substrate. Even with that provided stiffness, conventional substrates still tend to warp due to mismatches in the CTE's for the semiconductor chip, the underfill and the package substrate.

One conventional technique for addressing package substrate warpage involves the use of a stiffener ring on the semiconductor chip side of the package substrate. A typical conventional stiffener ring includes a central opening to accommodate the semiconductor chip while leaving a gap. The gap is used to dispense the aforementioned underfill. Underfill is conventionally dispensed in the gap as a dot or a line. After dispensing, capillary action draws the underfill into the space between the semiconductor chip and the package substrate.

Some conventional stiffener rings are made of metallic materials, while others are formed from plastics. Whether metal or plastic, an adhesive is typically used to secure the stiffener ring to the package substrate. The adhesive typically requires some form of thermal cure prior to chip attach to harden and bond the opposing surfaces. Prior to the thermal cure, the combination of the stiffener ring, the package substrate and the adhesive is placed in a fixture commonly referred to as a "bookcase." The quality of the adhesive bond is dependent on precise alignment between the stiffener frame and the package substrate and a predictable bond line thickness. Conventional bookcases may not sufficiently restrain relative movements of the stiffener frame and the package substrate, and may not apply sufficiently uniform loading to achieve desired bond line thickness variations.

The present invention is directed to overcoming or reducing the effects of one or more of the foregoing disadvantages.

SUMMARY OF EMBODIMENTS

In accordance with some embodiments, a method of coupling a circuit board to a stiffener frame is provided that includes positioning the stiffener frame in a fixture and positioning the circuit board on the stiffener frame. An adhesive is positioned between the stiffener frame and the circuit board. An alignment plate is positioned on the stiffener frame. The alignment plate has a shoulder to engage an edge of the stiffener frame. The alignment plate also includes a first opening with a peripheral wall to restrain movement of the circuit board relative to the stiffener frame.

In accordance with some embodiments, a method of manufacturing is provided that includes fabricating an alignment plate that has a shoulder to engage an edge of a stiffener frame adapted to couple to a circuit board. The alignment plate includes a first opening with a peripheral wall to restrain movement of the circuit board relative to the stiffener frame.

In accordance with some embodiments, an apparatus for engaging a stiffener frame and a circuit board positioned in a fixture is provided. The stiffener frame includes an edge. The apparatus includes an alignment plate that has a shoulder to engage the edge of the stiffener frame. The alignment plate includes a first opening with a peripheral wall to restrain movement of a circuit board relative to the stiffener frame.

BRIEF DESCRIPTION OF THE DRAWINGS

The foregoing and other advantages of the embodiments will become apparent upon reading the following detailed description and upon reference to the drawings in which.

DETAILED DESCRIPTION

Various embodiments of methods and apparatus for coupling a stiffener frame to a circuit board are disclosed. One example includes a bookcase engaging a stiffener frame and a circuit board. The bookcase includes an alignment plate that has a shoulder to engage the edge of the stiffener frame. The alignment plate includes a first opening with a peripheral wall to restrain movement of a circuit board relative to the stiffener frame. A coil spring is used to engage a compression plate against the circuit board. The bookcase provides more uniform loading against the circuit board and better restraint against board/frame movement. Additional details will now be described.

Figure 1:
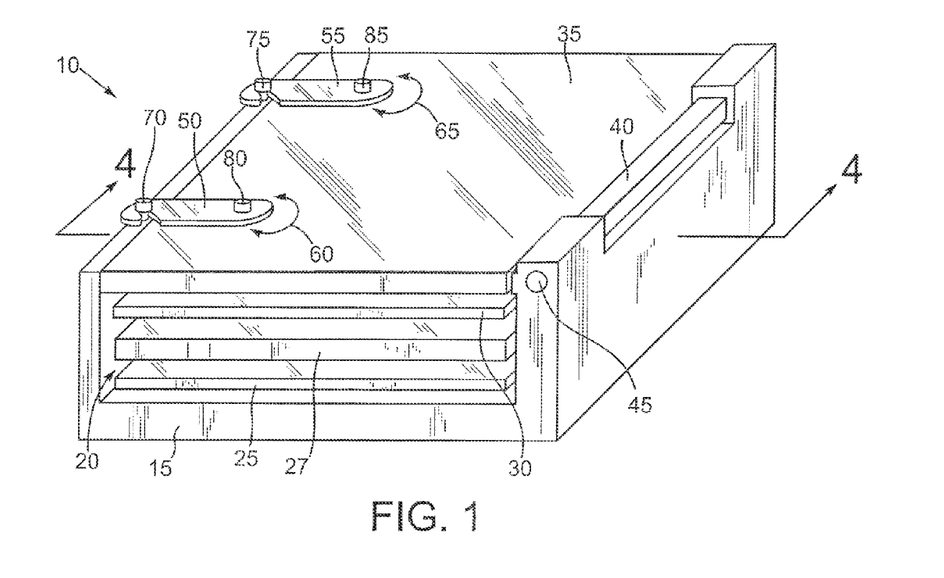
FIG. 1 is a pictorial view of an exemplary embodiment of a fixture or bookcase designed to hold various components, such as stiffener frames and circuit boards coupled thereto.

In the drawings described below, reference numerals are generally repeated where identical elements appear in more than one figure. Turning now to the drawings, and in particular to FIG. 1, therein is shown a pictorial view of an exemplary embodiment of a fixture or bookcase 10 designed to hold various components, such as stiffener frames and circuit boards coupled thereto. The bookcase 10 is designed to hold one or more stiffener frames and circuit boards (not visible) during various processing steps, such as component attach, heating, application of various films and materials etc. The bookcase 10 may include a generally U-shaped body 15 that has an interior space 20 for holding one or more members or plates 25, 27 and 30. The structure and function of the plates 25, 27 and 30 will be described in more detail below. The bookcase 10 may include a lid 35 that is pivotably connected to the body 15 by way of a hinge 40 and pin 45. The lid 35 may be secured in a closed position as shown in FIG. 1 by way of spaced-apart latches 50 and 55. The latches 50 and 55 are pivotable as indicated by the arrows 60 and 65 and operable to engage respective pins 70 and 75 that are coupled to the body 15. The latches 50 and 55 may be pivotably connected to the lid 35 by way of respective pins 80 and 85. As described more fully below, the lid 35 is operable to compress portions of the plate 30 against select portions of the circuit boards (not visible). However, it should be understood that a variety of different types of mechanisms other than the lid 35 and the body 15 may be used to provide compression of the plate 30. Furthermore, the skilled artisan will appreciate that a variety of mechanisms may be used to secure the lid 35 in place, such as latches, friction fits, magnets or virtually any other type of fastening mechanism. The components of the bookcase 10 as well as the plates 25, 27 and 30 are designed to hold relatively sensitive components, such as circuit boards, during various processing steps. Accordingly, it is desirable for the components of the bookcase 10 and the plates 25, 27 and 30 to be composed of relatively inert materials, such as stainless steel, aluminum, or other materials resistant to corrosion and/or contamination.

Figure 2:
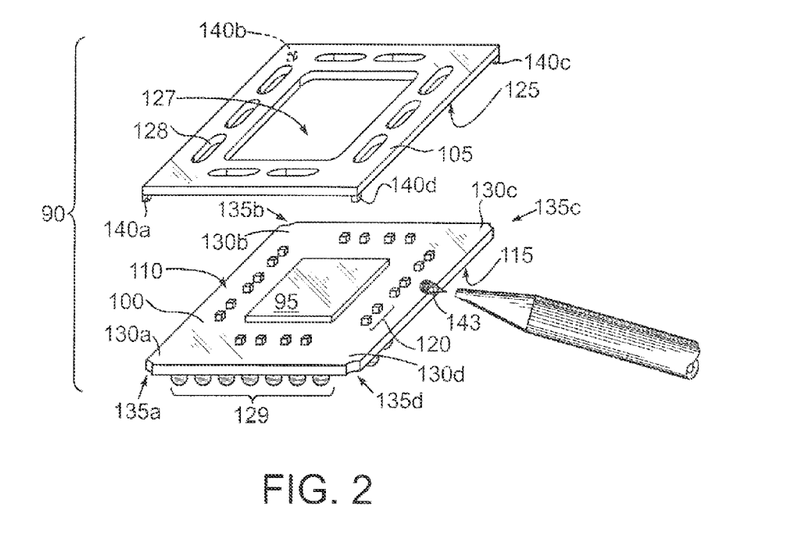
FIG. 2 is a pictorial view of an exemplary embodiment of a circuit board, stiffener frame and semiconductor chip mounted on the circuit board.

An exemplary embodiment of a semiconductor chip device 90 that may be held for processing purposes by the bookcase 10 depicted in FIG. 1 may be understood by referring now to FIG. 2, which is a partially exploded pictorial view. Here, the semiconductor chip device 90 may include a semiconductor chip 95 flip-chip or otherwise mounted to a circuit board 100 and a stiffener frame 105 also mounted to the circuit board 100. The circuit board 100 includes a top side 110 and a bottom side 115 and may have a square, rectangular or other footprint. The semiconductor chip 95 and the stiffener frame 105 may both be mounted to the top side 110. In addition, the top side 110 may be populated with plural components 120, which may be passive devices like capacitors, inductors or resistors, or active devices, such as integrated circuits. The stiffener frame 105 in this illustrative embodiment includes a flat seating surface 125 to seat on the circuit board 100 and vice versa, and a central opening 127 sized to accommodate one more electronic components, which might include the semiconductor chip 95 and the components 120. In addition, the stiffener frame 105 may be provided with plural slots, one of which is labeled 128. The slots 128 may be provided to accommodate the placement of the components such as the components 120. In this way, the stiffener frame 105 may be brought into engagement with the circuit board 100 and the various components, such as the components 120, may project up into one of the openings, such as the slot(s) 128. In this way, the actual surface area of the stiffener frame 105 that seats on the circuit board 100 may be increased to provide greater stiffness while still accommodating the placement of the components 120.

The semiconductor chip 95 and any alternatives thereof disclosed herein may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 95 may be constructed of bulk semiconductor, such as silicon or germanium, or semiconductor on insulator materials, such as silicon-on-insulators materials. The semiconductor chip 95 may be flip-chip mounted to the circuit board 100 and electrically connected thereto by solder joints, conductive pillars or other structures (not shown). Optionally, wire bonding may be used.

The circuit board 100 may be a package substrate, a circuit card, or virtually any other type of printed circuit board. Monolithic or buildup structures may be used. If a buildup design is used, the circuit board 100 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. The number of layers in the circuit board 100° C. can vary from four to sixteen or more, although less than four may be used. So-called "coreless" designs may be used as well. Indeed, coreless or other types of designs may benefit from the stiffness provided by the stiffener frame 121. The layers of the circuit board 100 consist of an insulating material, such as various well-known epoxies or other resins, interspersed with metal interconnects. A multi-layer configuration other than buildup could be used. Optionally, the circuit board 100 may be composed of well-known ceramics or other materials suitable for package substrates or other printed circuit boards.

To facilitate electrical interface with other circuit boards or devices, the circuit board 100 may be provided with an interconnect array 129, such as the depicted ball grid array, projecting from the bottom side 115. However, other types of interconnects may be used, such as pin grid arrays, land grid arrays or other types. The semiconductor chip 95 may be electrically interfaced with the circuit board 100 by way of plural interconnect structures (not visible), which may be solder joints, copper conductive pillars with or without solder or other interconnect structures. The semiconductor chip 95 may be covered with a lid or glob top or have another type of encapsulant (not shown).

Still referring to FIG. 2, each corner 130a, 130b, 130c and 130d of the circuit board 100 may be provided with a concave notch 135a, 135b, 135c and 135d. The notches 135a, 135b, 135c and 135d are designed to accommodate corresponding corner projections 140a, 140b, 140c and 140d of the stiffener frame 105. The circuit board 100 is designed to seat on the stiffener frame 105 and vice versa with the notches 135a, 135b, 135c and 135d accommodating the projections 140a, 140b, 140c and 140d. Note that the projection 140b is not visible and shown dashed. The notches 135a, 135b, 135c and 135d eliminate the potentially troublesome 90° corners of many conventional circuit board designs that are prone to damage. Furthermore, the projections 140a, 140b, 140c and 140d of the stiffener frame 105 protect the corners 130a, 130b, 130c and 130d from external impacts. In addition of course, the stiffener frame 105 functions like traditional stiffener frames in that it stiffens what otherwise might be a relatively flexible circuit board 100, particularly if the circuit board 100 is configured as a coreless organic substrate. Also, the projections can provide quick self-alignment capability to align the circuit board 100 with the stiffener frame 105. The stiffener frame 105 and disclosed alternatives thereof may be secured to the top side 110 of the circuit board 100 by an adhesive 143. The adhesive 143 may be a well-known epoxy or other type of polymeric adhesive or even a solder if the stiffener frame 105 and the circuit board 100 can tolerate solder application.

Figure 3:
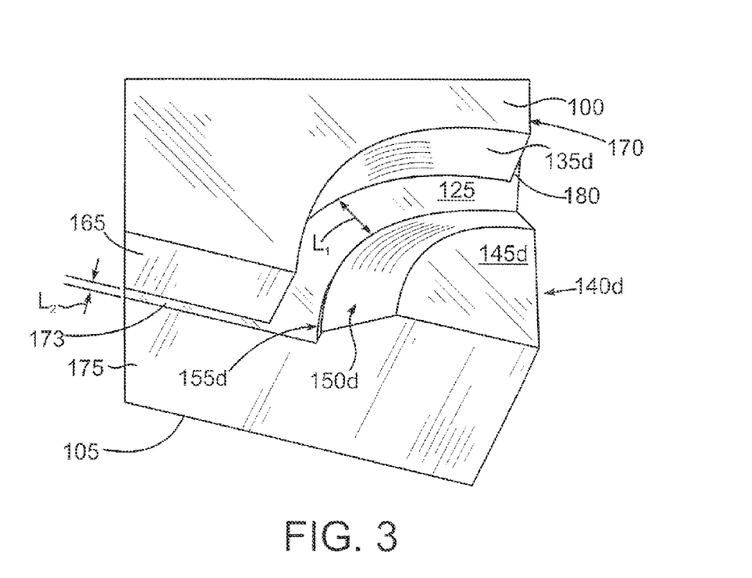
FIG. 3 is a pictorial view of corner portions of the exemplary circuit board and stiffener frame.

Attention is now turned to FIG. 3, which is a pictorial view of portions of the circuit board 100 and the stiffener frame 105 that include the notch 135d and the projection 140d. The following discussion of the notch 135d and the projection 140d of the stiffener frame 105 will be illustrative of the remainder of the circuit board 100 and the stiffener frame 105. The projection 140d may include an upper flat surface 145d that transitions to an arcuate slope surface 150d. The arcuate slope surface 150d may transition to a vertical arcuate surface 155d that terminates at the seating surface 125 of the stiffener frame 105 or may transition directly to the seating surface 125. In either case, the arcuate surface 150d provides a sloped surface to facilitate positioning of the notch 135d. The notch 135d of the circuit board 100 may be sized so that there is a setback of dimension L1 from the vertical arcuate surface 155d. The actual size L1 of the setback may be quite small, perhaps on the order of a millimeter or less. In addition, the edges 165 and 170 of the circuit board 100 may have a small setback 173 of, say, dimension L2 from the edges 175 and 180 of the stiffener frame 105. By making the external footprint of the stiffener frame 105 large enough to provide the setbacks L2 from the edges 165 and 170, those same edges 165 and 170 and the other edges not shown in FIG. 3 are protected from damage. The setback of dimension L2 will provide a seating surface for the plate 127 depicted in FIG. 1 and as described in more detail in conjunction with FIG. 4. Optionally, there need be no setback 173 of dimension L2 or otherwise at all. The notch 135d may be formed in the circuit board 100 by mechanical sawing, stamp punching, laser cutting or etching techniques as desired, or even by molding or during a build-up process.

The stiffener frame 105 and any others disclosed herein may be composed of a variety of materials, such as, for example, aluminum, copper, stainless steel, nickel, alloys of these or the like. Steel-nickel alloys, such as Invar, may provide favorably low thermal expansion. Optionally, well-known plastics may be used. In this illustrative embodiment, the projection 140d may be integrally formed with the stiffener frame 105. For example, the projection 140d may be formed by stamping, forging, casting, molding or machining or some combination of such processes as desired.

Figure 4:
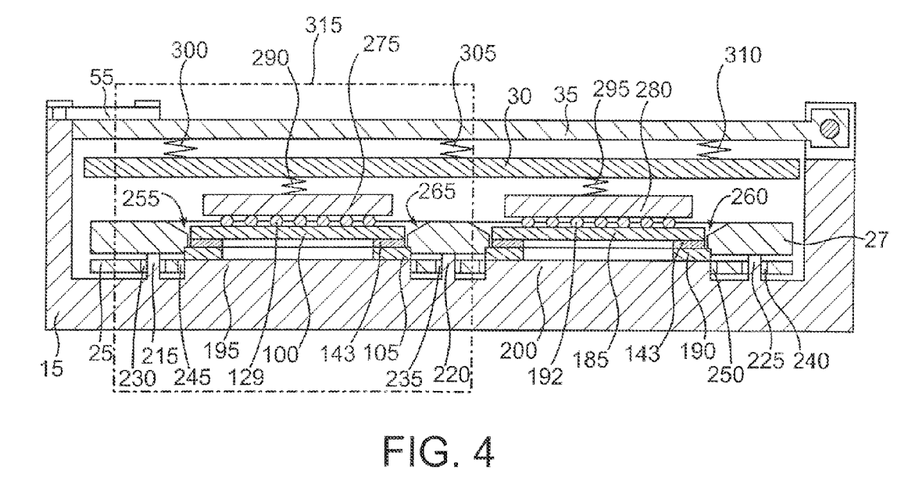
FIG. 4 is a sectional view of FIG. 1 taken at section 4-4.

Additional details of the bookcase 10 and the plates 25, 27 and 30 may be understood by referring now to FIG. 4, which is a sectional view of FIG. 1 taken at section 4-4. Due to the location of section 4-4, the latch 55 of the lid 35 is visible but the other latch 50 is not. As noted briefly above, the body 15 is designed to hold the plates 25, 27 and 30 as well as one or more circuit boards and stiffener frames. In this sectional view, two exemplary circuit boards 100 and 185 and respective stiffener frames 105 and 190 are visible and secured by the adhesive 143. The circuit boards 100 and 185 can number other than two, take on a variety of configurations, and be provided with a number of conductor traces and vias and other structures (not visible) in order to facilitate movement of power, ground and signals. The circuit board 185 may include an interconnect array 192 configured like the interconnect array 129 of the circuit board 100. To establish substantially planar support surfaces for the stiffener frames 105 and 190 and the circuit boards 100 and 185, the body 15 may be provided with upwardly projecting platforms or plateaus 195 and 200. The use of plateaus 195 and 200 provides for easier physical access to the circuit boards 100 and 185, but a purely planar surface supporting all of the circuit boards 100 and 185 could be used as well, or even another plate-like member (not shown) that includes the plateaus 195 and 200.

The stiffener frame 105 may be initially transported to the body 15 by way of the plate 25, which may be alternatively termed a "boat." When the plate 25 is seated in the body 15, physical support for the stiffener frames 105 and 190 is provided by the plateaus 195 and 200. The body 15 includes plural vertical projections, three of which are visible and labeled 215, 220 and 225. The projections 215, 220 and 225 are designed to provide relatively planar support for the plate 27 when in position. To accommodate the projections 215, 220 and 225, the plate 25 may include respective bores 230, 235 and 240 through which the projections 215, 220 and 225 project. In addition, the plate 25 includes holes 245 and 250, which are designed to slip over the plateaus 195 and 200, respectively, during placement in the body 15. Once the stiffener frames 105 and 190 are placed on the plateaus 195 and 200, the plate 27, which functions as an alignment plate, is seated in the body 15 and in particular on the stiffener frames 105 and 190. Because of the fine scale of FIG. 4, additional details of this seating and support process for the plate 27 will be shown in FIG. 5 to be described below. To accommodate the subsequent positioning of the circuit board 100, the plate 27 includes an opening 255, and a corresponding opening 260 positioned relative to the circuit board 185. The openings 255 and 260 include respective generally sloped surfaces 265 and 267, such that the bottom opening of the plate 27 is larger than the top opening of the plate 27, and that facilitate the easy placement of the circuit boards 100 and 185. Following positioning of the circuit boards 100 and 185 on the respective stiffener frames 105 and 190, the plate 30 is brought into physical engagement with the corresponding interconnect arrays 129 and 192 of the circuit boards 100 and 185 by way of respective compression plates 275 and 280, which are connected to the plate 30 by way of biasing members 290 and 295. The compression plates 275 and 280 may be composed of a variety of materials. Examples include various fluoroelastomers, such as Viton, various rubbers such as nitrile, or like materials. The biasing members 290 and 295 are advantageously fabricated as coil springs to provide a relatively uniform loading across the entire surfaces of the interconnect arrays 130 and 270. The plate 30 is, in turn, biased by way of the lid 35 and three or more biasing members 300, 305 and 310, which may be leaf springs, coil springs or other type of biasing members.

Figure 5:
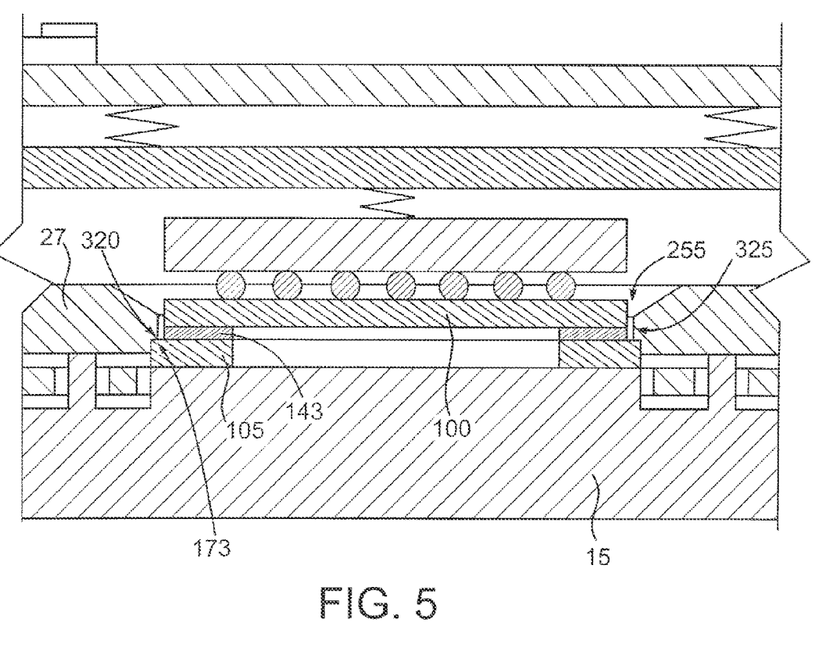
FIG. 5 is a portion of FIG. 4 shown at greater magnification.

The portion of FIG. 4 circumscribed by the dash and dot box 315 will be shown at greater magnification in FIG. 5 and used to describe additional details of the plate 27 and the engagement thereof with the stiffener frame 105. The following description is also applicable to other portions of the plate 27. Attention is now turned to FIG. 5. Note that the plate 27 includes a downwardly facing shoulder 320 which is designed to seat on the setback 173 of the stiffener frame 105. The opening 255 in the plate 27 includes a peripheral wall 325 that provides slight clearance for the circuit board 100. The peripheral wall 325 is designed to restrain movement of the circuit board 100 relative to the stiffener frame 105 while the adhesive 143 is undergoing a cure.

Figure 6:
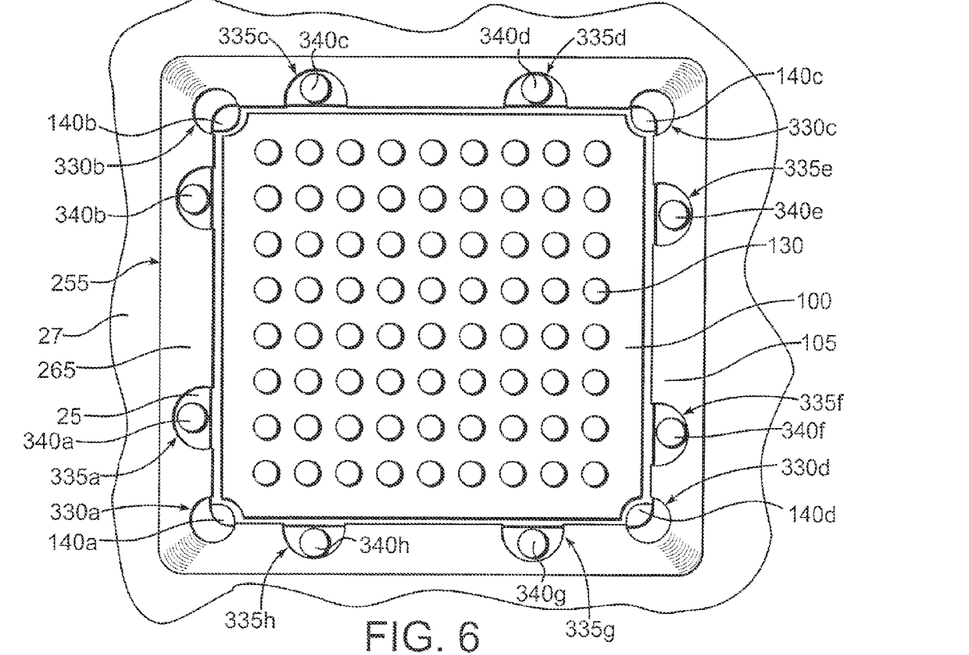
FIG. 6 is plan view of a portion of an exemplary alignment plate usable with the exemplary bookcase.

Additional details of the interaction between the plate 27, the circuit board 100 and the stiffener frame 105 may be understood by referring now to FIG. 6, which is a plan view of a portion of the plate 27 that includes the opening 255 and the sloped surface 265 described above in conjunction with FIG. 4. Here, the circuit board 100 is visible along with the interconnect array 129 thereof. A peripheral portion and the projections 140a, 140b, 140c and 140d of the stiffener frame 105 are visible. The opening 255 may be provided with plural alignment notches. In particular, corner notches 330a, 330b, 330c and 330d may be formed in the plate 27, in and around the opening 255, to accommodate the special positioning of the stiffener frame projections 140a, 140b, 140c and 140d and to bear against those projections 140a, 140b, 140c and 140d to prevent rotation of the stiffener frame 105 during attachment to the circuit board 100. In addition, the plate 27 may include additional slots 335a, 335b, 335c, 335d, 335e, 335f, 335g and 335h that are designed to accommodate alignment pegs 340a, 340b, 340c, 340d, 340e, 340f, 340g and 340h of the underlying plate 25. The alignment pegs 340a, 340b, 340c, 340d, 340e, 340f, 340g and 340h are utilized to hold the stiffener frame 105 in position during transport as noted above. Of course, the number, shape and position of the slots 335a, 335b, 335c, 335d, 335e, 335f, 335g and 335h will depend upon the configuration of the underlying plate 25 and may be varied as necessary. Furthermore, the footprint of the opening 255 may take on the same type of footprint as the stiffener frame 105 and the circuit board 100 as desired.

Figure 7:
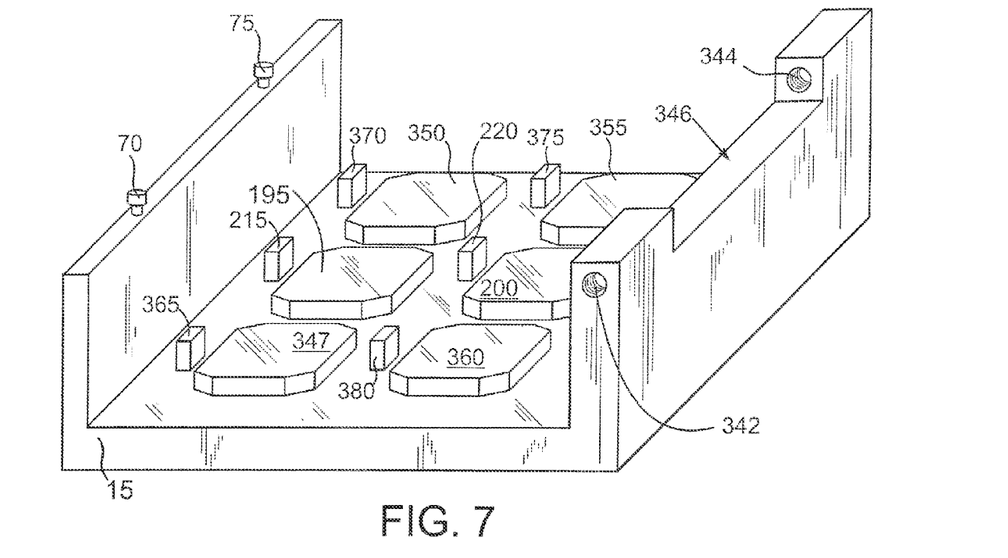
FIG. 7 is a pictorial view of an exemplary embodiment of a bookcase body.

Additional details of the body 15 may be understood by referring now to FIG. 7, which is a pictorial view with the lid 35 and the pin 45 shown in FIG. 1 removed as well as without the plates 25, 27 and 30 or any of the circuit boards positioned thereon. To hold the pin 45 shown in FIGS. 1 and 2, the body 15 is provided with bores 342 and 344. To accommodate the hinge 40 shown in FIG. 1, portions of the body 15 that include the bores 342 and 344 are separated by a cutout 346. The latch pins 70 and 75 on the opposite side of the cutout 346 are visible. The body 15 in this illustrative embodiment may include six plateaus, two of which were previously discussed and labeled 195 and 200, and four more that are labeled 347, 350, 355 and 360. Here, the plateaus 195, 200, 345, 350, 355 and 360 may have the generally octagonal footprint as shown. Optionally, virtually any other shape that is appropriate for supporting the stiffener frame and/or circuit board embodiments disclosed herein may be used. In addition, two of the support members 215 and 220 that were previously visible in FIG. 3 are shown along with four other support members 365, 370, 375 and 380 are visible and it should be understood that additional support members including the support member 225 shown in FIG. 3 but not visible in FIG. 7 may be placed as well. Furthermore, and as noted above, the functionality of the plateaus 195, 200, 347, 350, 355 and 360 and the support members 215, 220, 265, 370, 375 and 380 may be provided by a separate member (not shown) that may be dropped in on the body 15 if desired.

Figure 8:
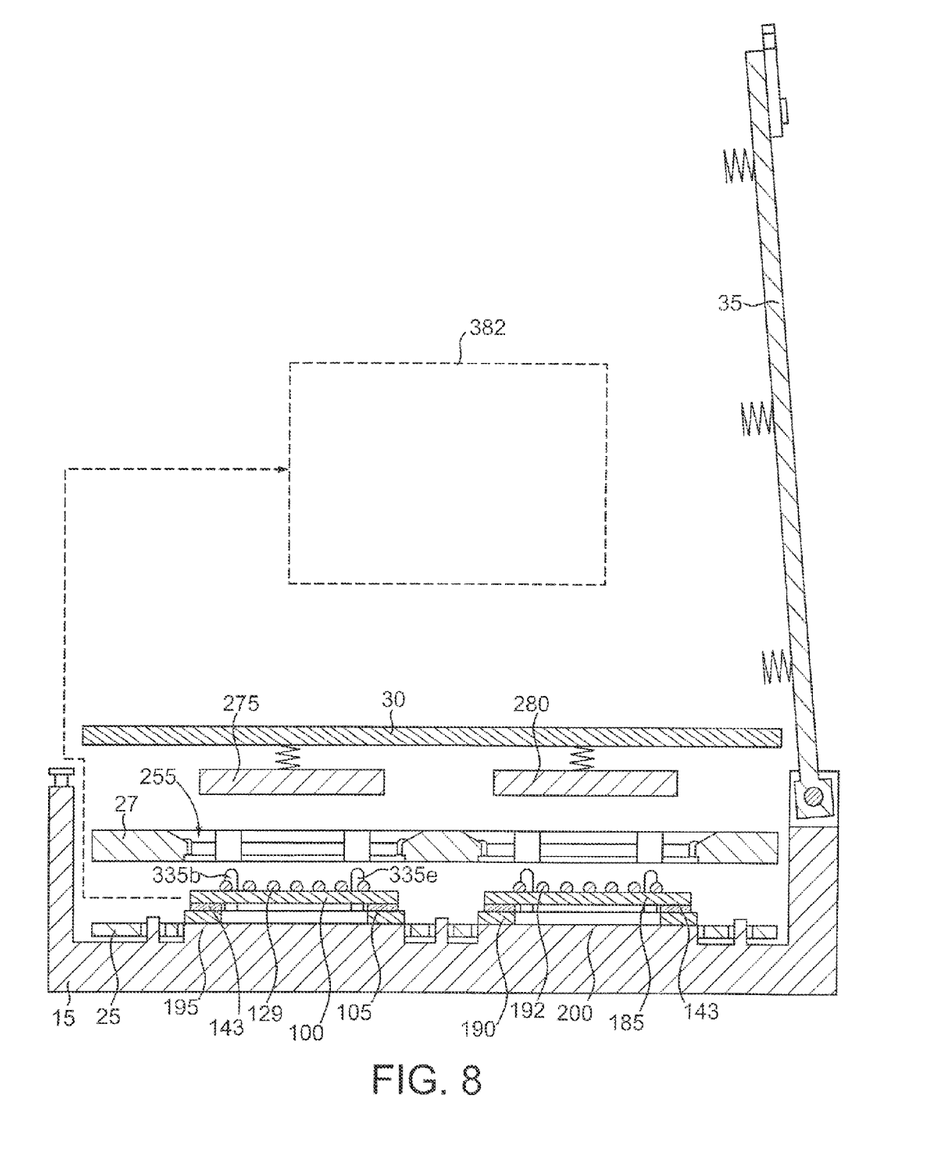
FIG. 8 is a sectional view of the exemplary bookcase with the alignment plate exploded and a furnace shown schematically.

An exemplary method for attaching a stiffener frame to a circuit board may be understood by referring now to FIG. 8, which is a sectional view of the bookcase 10 with the lid 35 flipped open and the plates 27 and 30 exploded vertically from the body 15. Note here that a few of the support pegs 335b and 335e of the plate 25 are visible. Initially, the circuit boards 100 and 185 are positioned on the plateaus 195 and 200 with or without the benefit of the plate 25. Before, after or simultaneously, the adhesive 143 may be applied to the stiffener frames 105 and 190 by dispensing, brushing, spraying or the like. The stiffener frames 105 and 190 and the adhesive 143 may then be heated in a suitable furnace 382 to precure the adhesive 143. The purpose of the precure is to compel a preliminary outgassing of vapors and other constituents from the adhesive 143. Suitable temperatures and times for the precure will depend on the compositions of the adhesive 143 and the stiffener rings 105 and 190. Fast curing adhesives may require as little as about 2.0 minutes at 100° C., however, a precure time of about 3 to 10 minutes at 100° will be more typical. Subsequent to the precure, the plate 27 may be dropped down and seated on the circuit boards 100 and 185, the plate 30 may be dropped down and the compression plates 275 and 280 seated on the interconnect arrays 129 and 192, and the lid 35 pivoted down to compress the compression plates 275 and 280 against the interconnect arrays, which will compress the adhesive 143. With the lid 35 down, a final thermal cure of the adhesive 143 may be provided by positioning the entire bookcase 10 in a suitable furnace, such as the furnace 382, and heated to about 125° C. for about 1.5 hours to final cure. Again the temperature and time will depend on the adhesive used.

As shown in FIG. 7, following the placement of the plate 25 in the body 15, the stiffener frames 105 and 190 are positioned on the plateaus 195 and 200 respectively. Again using only the stiffener frame 105 and the circuit board 100 for discussion purposes, the plate 27 may be dropped into position so that the opening 255 is positioned over the circuit board 100 and the stiffener frame 105 and dropped into the general position shown in FIG. 3. Thereafter, the plate 30 may be positioned so that the compression plates 275 and 280 may bear against the circuit boards 100 and 185 and the lid 35 closed to bring the compression plates 275 and 280 into a full state of compression. Thereafter, the bookcase 10 may be inserted into an appropriate furnace and the adhesives 143 may be cured.

Figure 9:
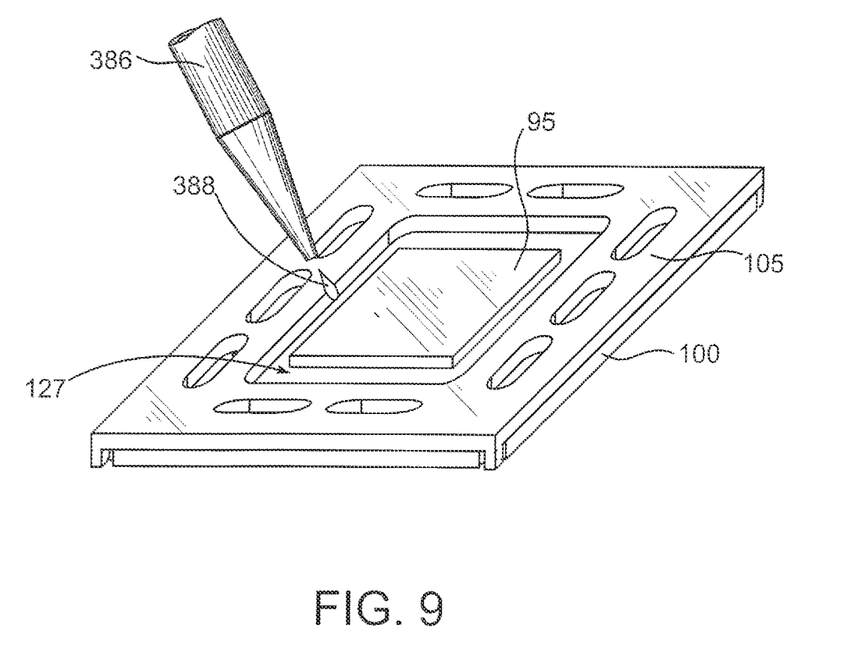
FIG. 9 is a pictorial view of the exemplary circuit board and semiconductor chip undergoing underfill application.

Following the attachment of a stiffener frame to a given circuit board, a semiconductor chip may be flip-chip attached thereto and an underfill material applied. Suitable types of application processes for the underfill material will depend on, among other things, the type of stiffener frame attachment process used. With this backdrop, attention is now turned to FIG. 9, which is a pictorial view of the exemplary semiconductor chip 95 flip-chip mounted to the circuit board 100. A suitable applicator 386 may be used to dispense underfill 388 through the opening 127 in the stiffener frame and on the circuit board 100 proximate the semiconductor chip 95. The application may be with or without a seal pass. The underfill 388 may be composed of well-known epoxy materials, such as epoxy resin with or without silica fillers and phenol resins or the like. Two examples are types 8437-2 and 2BD available from Namics. A bake cure may follow application.

Figure 10:
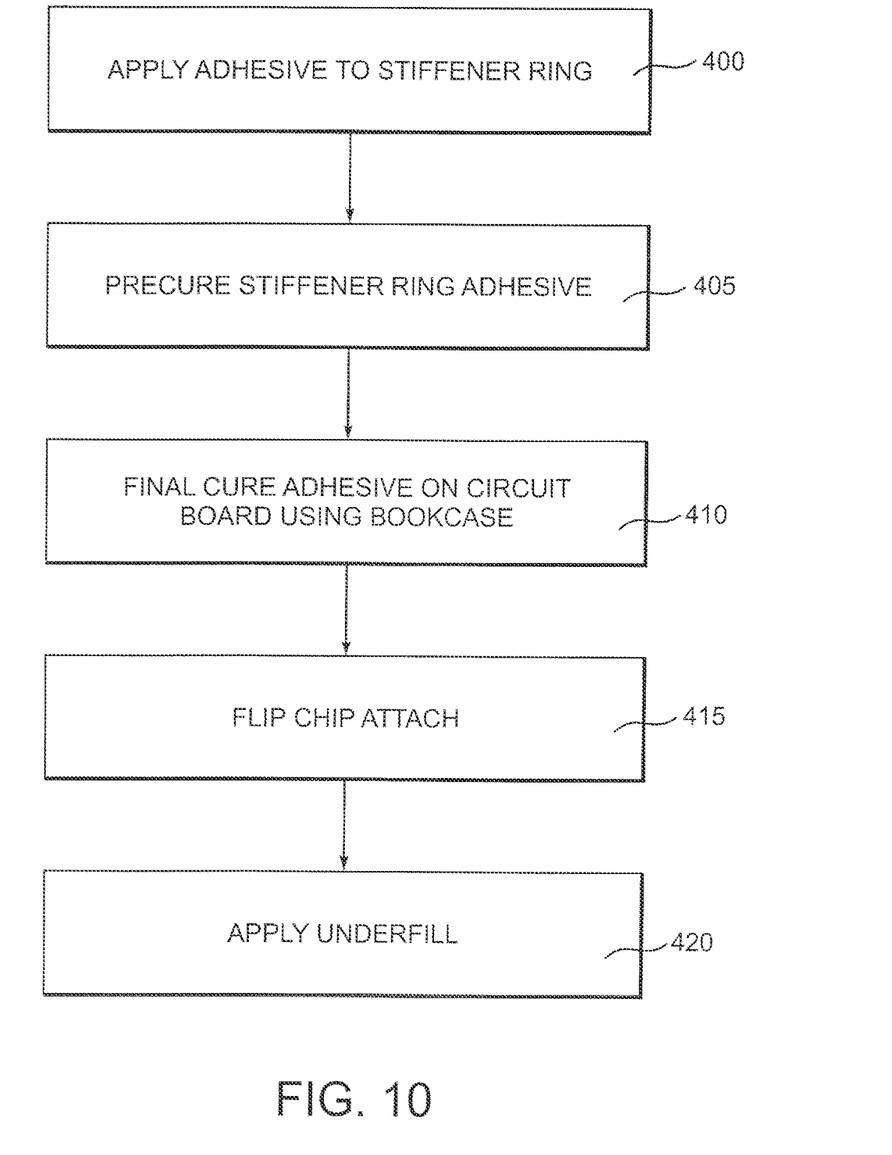
FIG. 10 is a flow chart of an exemplary stiffener frame attach process.
Figure 11:
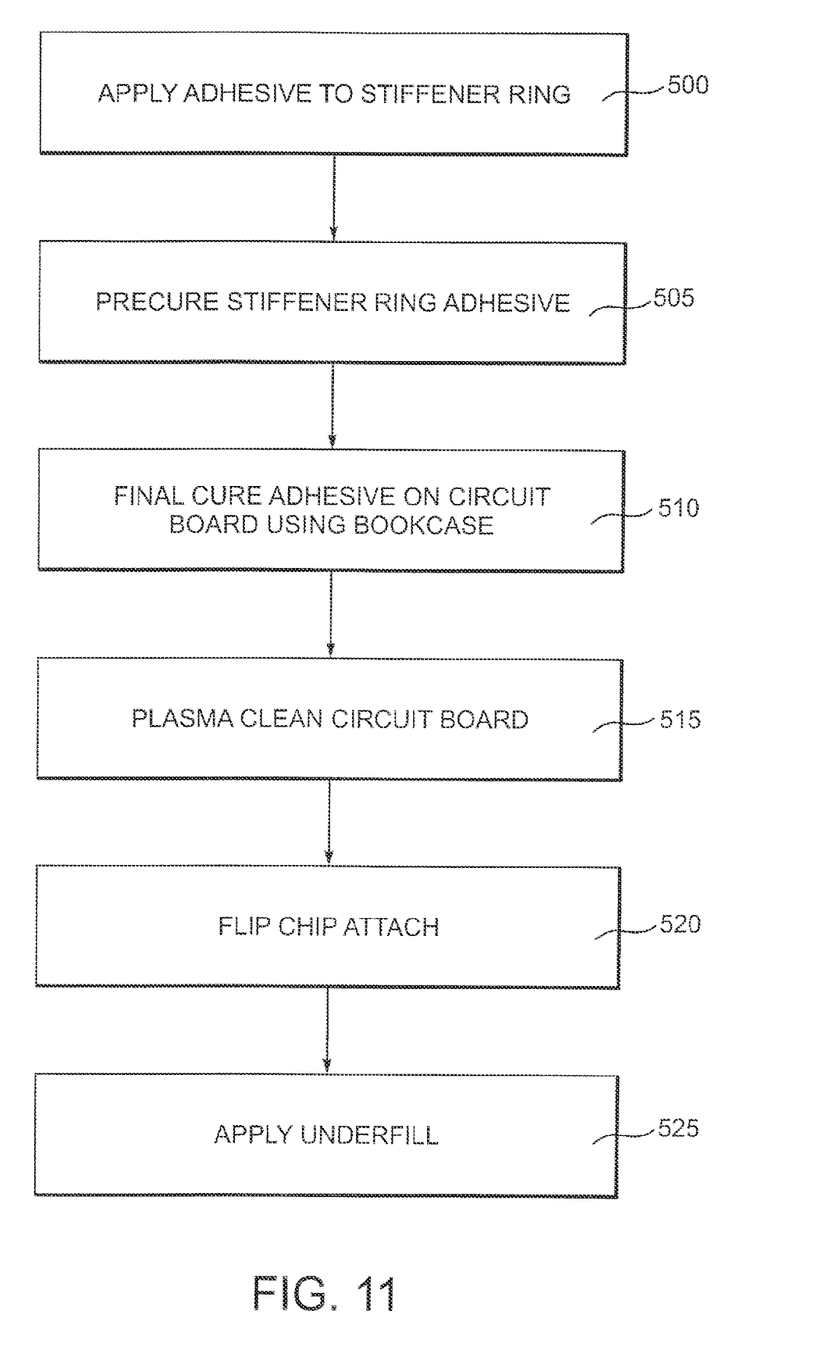
FIG. 11 is a flow chart of an alternate exemplary stiffener frame attach process.

Flow charts for two exemplary methods are depicted in FIGS. 10 and 11. Referring first to FIG. 10, at step 400 an adhesive may be applied to a stiffener ring, at step 405 the stiffener ring adhesive may undergo a precure as described elsewhere herein, at step 410 the adhesive may be subject to a final cure on a circuit board using the aforementioned bookcase 10, at step 415 a semiconductor chip may be flip-chip attached to the circuit board, and at step 420 an underfill may be applied without a seal pass if desired. An alternate process flow is depicted pictorially in FIG. 11. In this illustrative method, at step 500 an adhesive is applied to a stiffener ring, at step 505 the stiffener ring adhesive is subjected to a precure, at step 510 a final thermal cure is performed on the stiffener frame using the aforementioned bookcase 10, at step 515 the circuit board is subjected to a plasma treatment for contaminant cleansing, at step 520 a semiconductor chip may be flip-chip attached to the circuit board, and at step 525 an underfill material may be dispensed preferentially using a seal pass.

While the embodiments may be susceptible to various modifications and alternative forms, specific embodiments have been shown by way of example in the drawings and have been described in detail herein. However, it should be understood that the embodiments are not intended to be limited to the particular forms disclosed. Rather, the invention is to cover all modifications, equivalents and alternatives falling within the spirit and scope of the invention as defined by the equivalents and alternatives falling within the spirit and scope of the invention as defined by the following appended claims.

What is claimed is:

1. A method for engaging a stiffener frame and a circuit board positioned in a fixture, comprising:
    positioning an alignment plate on the stiffener frame, such that a downwardly facing shoulder of a bottom opening of the alignment plate is seated on a setback of the stiffener frame, wherein the bottom opening of the alignment plate is larger than a top opening of the alignment plate; and
    positioning the circuit board on the stiffener frame, wherein the stiffener frame is seated below the circuit board;
    wherein the alignment plate restrains movement of the circuit board relative to the stiffener frame with a peripheral wall of the top opening of the alignment plate.

2. The method of claim 1, further comprising thermally curing an adhesive between the stiffener frame and the circuit board.

3. The method of claim 2, further comprising placing the fixture in an oven to cure the adhesive.

4. The method of claim 2, further comprising precuring the adhesive prior to positioning the circuit board.

5. The method of claim 1, wherein the fixture includes a body having plural projections, the method comprising positioning the alignment plate on the plural projections.

6. The method of claim 1, further comprising facilitating placement of the circuit board in the bottom opening with a sloped wall in the alignment plate.

7. The method of claim 1, wherein an external footprint of the stiffener frame is larger than an external footprint of the circuit board.

8. The method of claim 1, wherein said stiffener frame comprises an opening, and wherein the method further comprises mounting a semiconductor chip to the circuit board through said opening of the stiffener frame.

9. The method of claim 8, further comprising positioning an underfill between the semiconductor chip and the circuit board.

10. The method as recited in claim 1, further comprising a first plate, a coil spring coupled to the first plate, and a second plate coupled to the coil spring; and wherein the method further comprises positioning the coil spring between the first plate and second plate such that it provides uniform loading of the first plate toward the stiffener frame and compressibly engages the second plate against the circuit board.

11. The method as recited in claim 10, further comprising positioning an adhesive between the stiffener frame and the circuit board and curing the adhesive.

12. The method as recited in claim 1, wherein an external footprint of the stiffener frame includes at least four sides and the downwardly facing shoulder of the alignment plate is seated on at least the four sides.

13. A method of manufacturing an alignment plate, comprising:
    fabricating an alignment plate having a shoulder to engage an edge of a stiffener frame adapted to couple to a circuit board, wherein the alignment plate includes a first opening with a peripheral wall to restrain movement of the circuit board relative to the stiffener frame.

14. The method of claim 13, comprising forming the first opening with a sloped wall to facilitate placement of the circuit board in the first opening.

15. The method of claim 13,
    wherein the stiffener frame includes plural corner projections; and
    wherein the method comprises forming plural second openings in the alignment plate to enable the plural corner projections to project therethrough.

16. The method of claim 13, comprising:
    fabricating a body having plural projections adapted to support the alignment plate; and
    seating the alignment plate on the plural projections.

17. The method of claim 13, comprising:
    fabricating a body having a first plate, a coil spring coupled to the first plate, and a second plate coupled to the coil spring, the stiffener frame and the circuit board being seated on the body;
    wherein compression of the first plate toward the stiffener frame compressibly engages the second plate with the circuit board.

18. The method of claim 13, further comprising coupling a lid to the body, the lid being operable to compress the first plate toward the stiffener frame.

19. An alignment plate for engaging a stiffener frame and a circuit board positioned in a fixture, comprising:
    a top opening with a peripheral wall to restrain movement of the circuit board relative to the stiffener frame, wherein the stiffener frame is seated below the circuit board; and
    a bottom opening with a downwardly facing shoulder to seat on a setback of the stiffener frame, wherein the bottom opening is larger than the top opening;
    wherein the alignment plate restrains movement of the circuit board relative to the stiffener frame with the peripheral wall of the top opening of the alignment plate.

20. The apparatus of claim 19, wherein the bottom opening includes a sloped wall to facilitate placement of the circuit board in the first opening.

21. The apparatus of claim 19, wherein the stiffener frame includes plural corner projections, the alignment plate including plural second openings to enable the plural corner projections to project therethrough.

22. The apparatus of claim 19, further comprising a body having plural projections, the stiffener frame being seated on the body, the alignment plate being seated on the plural projections.

23. The alignment plate of claim 19, wherein an external footprint of the stiffener frame is larger than an external footprint of the circuit board.

24. The alignment plate as recited in claim 19, wherein an external footprint of the stiffener frame includes at least four sides and the downwardly facing shoulder of the alignment plate is seated on at least the four sides.

\* \* \* \* \*

UNITED STATES PATENT AND TRADEMARK OFFICE
CERTIFICATE OF CORRECTION

PATENT NO. : 9,349,628 B2  Page 1 of 1
APPLICATION NO. : 13/848549
DATED : May 24, 2016
INVENTOR(S) : Lau et al.

It is certified that error appears in the above-identified patent and that said Letters Patent is hereby corrected as shown below:

In the title page:

Item 57, Abstract, line 8, please delete "the a top opening" and substitute -- the top opening --.

Item 57, Abstract, line 12, please delete "of a the top opening" and substitute -- of the top opening --.

Signed and Sealed this
Second Day of August, 2016

Michelle K. Lee
*Director of the United States Patent and Trademark Office*